United States Patent
Urano

(10) Patent No.: US 8,802,460 B2
(45) Date of Patent: Aug. 12, 2014

(54) METHOD OF MOUNTING LED CHIP

(75) Inventor: Youji Urano, Ikeda (JP)

(73) Assignee: Panasonic Corporation, Kadoma-Shi, Osaka (JP)

( * ) Notice: Subject to any disclaimer, the term of this patent is extended or adjusted under 35 U.S.C. 154(b) by 0 days.

(21) Appl. No.: 12/733,401

(22) PCT Filed: Aug. 28, 2008

(86) PCT No.: PCT/JP2008/065452

§ 371 (c)(1),
(2), (4) Date: Feb. 26, 2010

(87) PCT Pub. No.: WO2009/028627

PCT Pub. Date: Mar. 5, 2009

(65) Prior Publication Data

US 2010/0210048 A1   Aug. 19, 2010

(30) Foreign Application Priority Data

Aug. 28, 2007   (JP) ................................. 2007-221827

(51) Int. Cl.
*H01L 21/00*   (2006.01)

(52) U.S. Cl.
USPC .......................................................... 438/26

(58) Field of Classification Search
USPC .......................................................... 438/26
See application file for complete search history.

(56) References Cited

U.S. PATENT DOCUMENTS

| 6,204,558 | B1 | 3/2001 | Yanagida |
| 2003/0011069 | A1* | 1/2003 | Shibata ........................ 257/734 |
| 2006/0063287 | A1 | 3/2006 | Andrews |
| 2006/0214274 | A1 | 9/2006 | Shimokawa et al. |
| 2007/0181987 | A1 | 8/2007 | Hong et al. |

FOREIGN PATENT DOCUMENTS

| EP | 1531492 A2 | 5/2005 |
| JP | 57-89194 | 5/1982 |
| JP | 02-150041 A | 6/1990 |
| JP | 04-321281 A | 11/1992 |

(Continued)

OTHER PUBLICATIONS

International Search Report for corresponding International Application No. PCT/JP2008/065452, dated Sep. 12, 2008, mailed Sep. 22, 2008.

(Continued)

*Primary Examiner* — Charles Garber
*Assistant Examiner* — Andre' C Stevenson
(74) *Attorney, Agent, or Firm* — Edwards Wildman Palmer LLP; James E. Armstrong, IV; Jonathon P. Western

(57) ABSTRACT

A method of mounting an LED chip, which is intended to suppress void-generation inside an eutectic bonding without use of flux. This method includes a step of eutectically bonding a first metal layer (e.g., AuSn layer) on a rear surface of the LED chip, with a metal ground layer on a dielectric substrate (mounting member). This method includes a step of providing a second metal layer having the same metal component as the first metal layer, to the top surface of the metal ground layer on a dielectric substrate; and subsequently connecting the LED chip and the dielectric substrate by way of eutectically bond while the dielectric substrate is heated at its bottom surface remote from the metal ground layer to melt the second metal layer by heat source (heater or the like).

2 Claims, 8 Drawing Sheets

(56) References Cited

FOREIGN PATENT DOCUMENTS

| | | |
|---|---|---|
| JP | 09-051108 A | 2/1997 |
| JP | 2000-077449 A | 3/2000 |
| JP | 2001-144127 A | 5/2001 |
| JP | 2002-334906 A | 11/2002 |
| JP | 2003-198038 A | 7/2003 |
| JP | 2004-004195 A | 1/2004 |
| JP | 2006-269751 A | 10/2006 |
| JP | 2007-134744 A | 5/2007 |
| JP | 2007-149976 A | 6/2007 |
| JP | 2007-528601 T | 10/2007 |
| WO | WO-2005/086220 A1 | 9/2005 |

OTHER PUBLICATIONS

Office Action mailed Oct. 16, 2012, issued for the counterpart Japanese Patent Application No. 2007-221827.

Supplementary European Search Report dated Feb. 5, 2013, issued for the counterpart European patent application No. 08828584.6.

Office Action mailed Jul. 31, 2012, issued for the counterpart Japanese Patent Application No. 2007-221827.

* cited by examiner

METHOD OF MOUNTING LED CHIP

TECHNICAL FIELD

This invention relates to a method of mounting LED chip.

BACKGROUND ART

Many studies have been widely carried out to develop light emitting device which radiates a mixed-color light and luminaire using the light emitting device so far. The light emitting device includes an LED chip and a phosphor. (e.g., Reference 1) The phosphor acts as a wavelength conversion member which is excited by a light emitted from LED chip and emits a light of color different from the luminescent color of the LED. The light emitting device is capable of radiating a light of mixed-color which is different from the luminescent color of LED, when including the phosphor and the LED chip. For example, it is known that the blue-color or UV LED chip can be combined with the phosphor to give a light emitting device which radiates a white-color light (white-color luminescent spectrum).

For example, the light emitting device radiating white-color light is combined with each other for being applied to a luminaire. However, in this luminaire, a plurality of the light emitting device is required to be disposed on the circuit substrate, and accommodated within the main body. As a result, this luminaire may suffer from an excessive thermal resistance between the LED chip and the main body. In view of this problem, this light emitting device luminaire needs to be controlled to give a limited input electric power to the LED chip such that a junction temperature of the LED chip is kept below the maximum of junction temperature. As a result, this light emitting device may give a limited light output.

In the light emitting device using LED chip, the LED chip is required to be mounted on a highly thermal conductive mounting member, in order to smoothly dissipate outward heat and achieve an improved light output. The mounting member can be formed of a sub-mount member or a ceramic substrate which is secured to the heat conducting plate to relieve a stress acting on the LED chip due to a difference of coefficient of linear expansion between the LED chip and the heat conducting plate.

For example, Japanese unexamined patent publication 2007-149976 discloses a method of eutectically bonding the LED chip and a patterned conductor of the mounting member by way of an eutectic alloy layer (e.g., AuSn layer) which is disposed on rear surface of the LED chip, in the process of mounting the LED chip to the mounting member.

For example, Japanese unexamined patent publication 2007-149976 discloses that the LED chip is mounted to the mounting substrate by means of a reflow apparatus, after both an eutectic alloy layer provided on the LED chip and the mounting substrate are wetted with the flux. For example, it is known that the LED chip is moved closer to a patterned conductor provided on the mounting substrate and then connected thereto through the eutectic bond by means of a die bonding apparatus, while the mounting substrate is heated at its bottom surface by using a heater.

In this method of mounting the LED chip in Japanese unexamined patent publication 2007-149976, the eutectic bond can be free from void generation. But, this process needs the use of flux, possibly leaving residues on the mounting member.

In the method of mounting LED chip by means of the die-bonding apparatus, the eutectic alloy layer provided on a rear surface of the LED chip is moved closer to a patterned conductor provided on the mounting substrate. In this method, external air may be entrapped between the eutectic alloy layer provided on a rear surface of the LED chip and the patterned conductor provided on the mounting substrate, degenerating thermal conductivity between the patterned conductor provided on the mounting substrate and the eutectic alloy layer. Besides, the eutectic bond may undergo ununiform temperature due to a partial sudden boiling when the melted eutectic alloy layer comes to contact with the patterned conductor, suffering from void-generation inside the eutectic bond, and eventually increasing the thermal resistance between the LED chip and the mounting member. In addition, it is difficult to suitably control temperature and time of heating the melted eutectic alloy layer in accordance with thermal resistance of the LED chip. (For example, the eutectic alloy layer made of AuSn needs to be heated for five seconds or less, when the heating temperature is set at 325° C.)

DISCLOSURE OF THE INVENTION

A method of mounting an LED chip in the present invention has been accomplished in view of the above problem, and intended to suppress void-generation inside an eutectic bonding without use of flux.

The present invention relates to the method of mounting the LED chip to a dielectric substrate by way of a metallic bond. The method in the present invention comprises a step of forming a metal ground layer on a top surface of the dielectric substrate; a step of forming a first metal layer of an eutectic alloy on a bottom surface of the LED chip; a step of providing a second metal layer having the same metal component as the first metal layer, to the top surface of the metal ground layer; and a step of heating the dielectric substrate at its bottom surface remote from the metal ground layer to melt the second metal layer, subsequently bonding the first metal layer with the second metal layer. The method in the present invention enables to suppress the void-generation inside metal layers without use of flux.

The second metal layer is preferably formed of an eutectic alloy containing the same metals as the first metal layer, and further preferably has the same metal composition ratio as the first metal layer so as to improve the uniformity of the metal layers. Instead, the second metal layer preferably has a metal composition ratio different from that of the first metal layer, and a melting point higher than the first metal layer, for being easily bonded with the first metal layer. Each of the first metal layer and the second metal layer is preferably formed of an eutectic Au—Sn alloy. The metal ground layer preferably has an Au layer at its top. The second metal layer is preferably formed over a top of the Au layer with a Pt layer interposed therebetween. Each of the Pt layer and the second metal layer preferably has the same plane size as the LED chip. The method in the present invention is capable of generating the eutectic bond of the AuSn eutectic alloy as well as preventing an excessive extension of the eutectic bond.

The second metal layer preferably includes a plurality of metal layers each containing any one of metals forming said first metal layer. In addition, it is preferable that the first metal layer is made of an eutectic Au—Sn alloy, and the metal ground layer has an Au layer at its top. It is preferable that a plurality of the metal layers forming the second metal layer include an Sn layer formed on the Au layer of the metal ground layer, and an Au layer formed on the Sn layer. The method in the present invention is capable of generating the eutectic bond of AuSn eutectic alloy as well as preventing an excessive extension of the eutectic bond.

BEST MODE FOR CARRYING OUT THE INVENTION

Hereafter, explanations are given as to a light emitting device in an embodiment, with reference to FIGS. 1 to 8.

Figure 1:
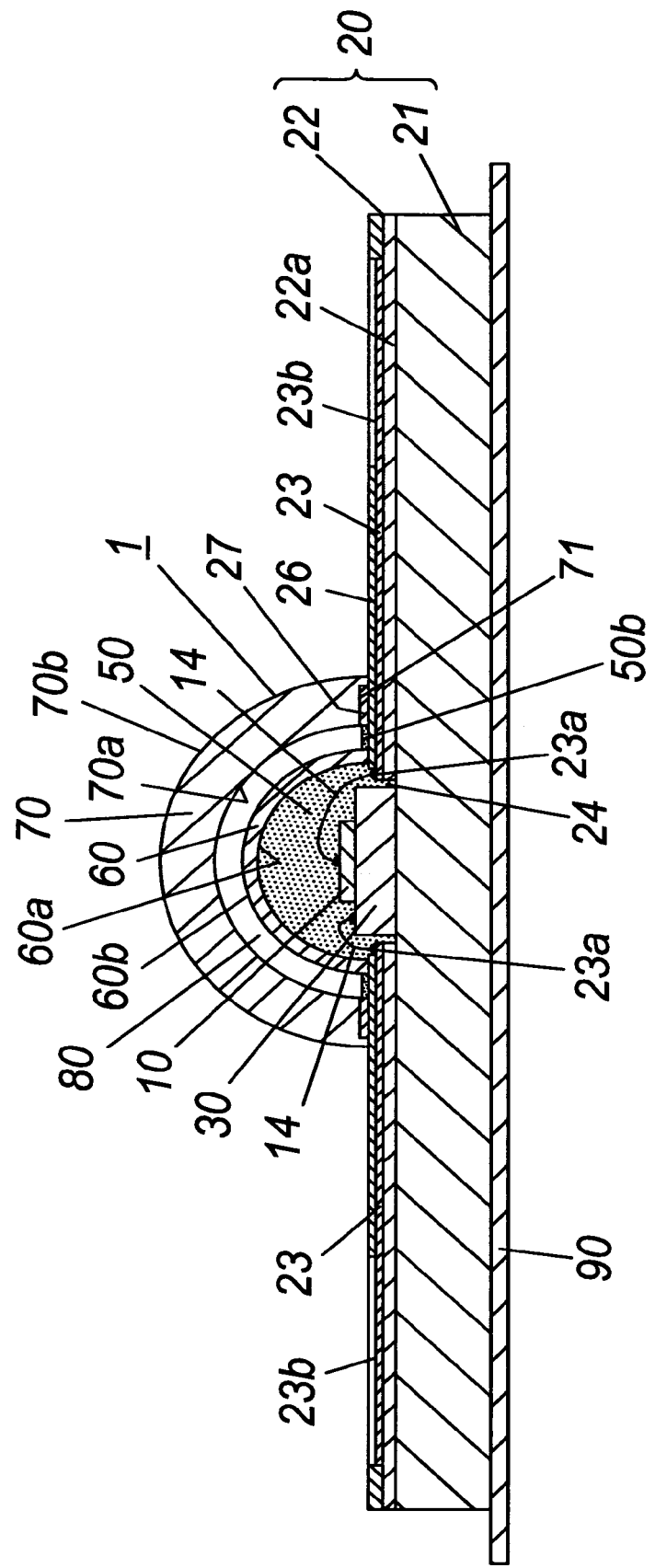
FIG. 1 shows a front sectional view of a light emitting device in accordance with one embodiment.
Figure 2:
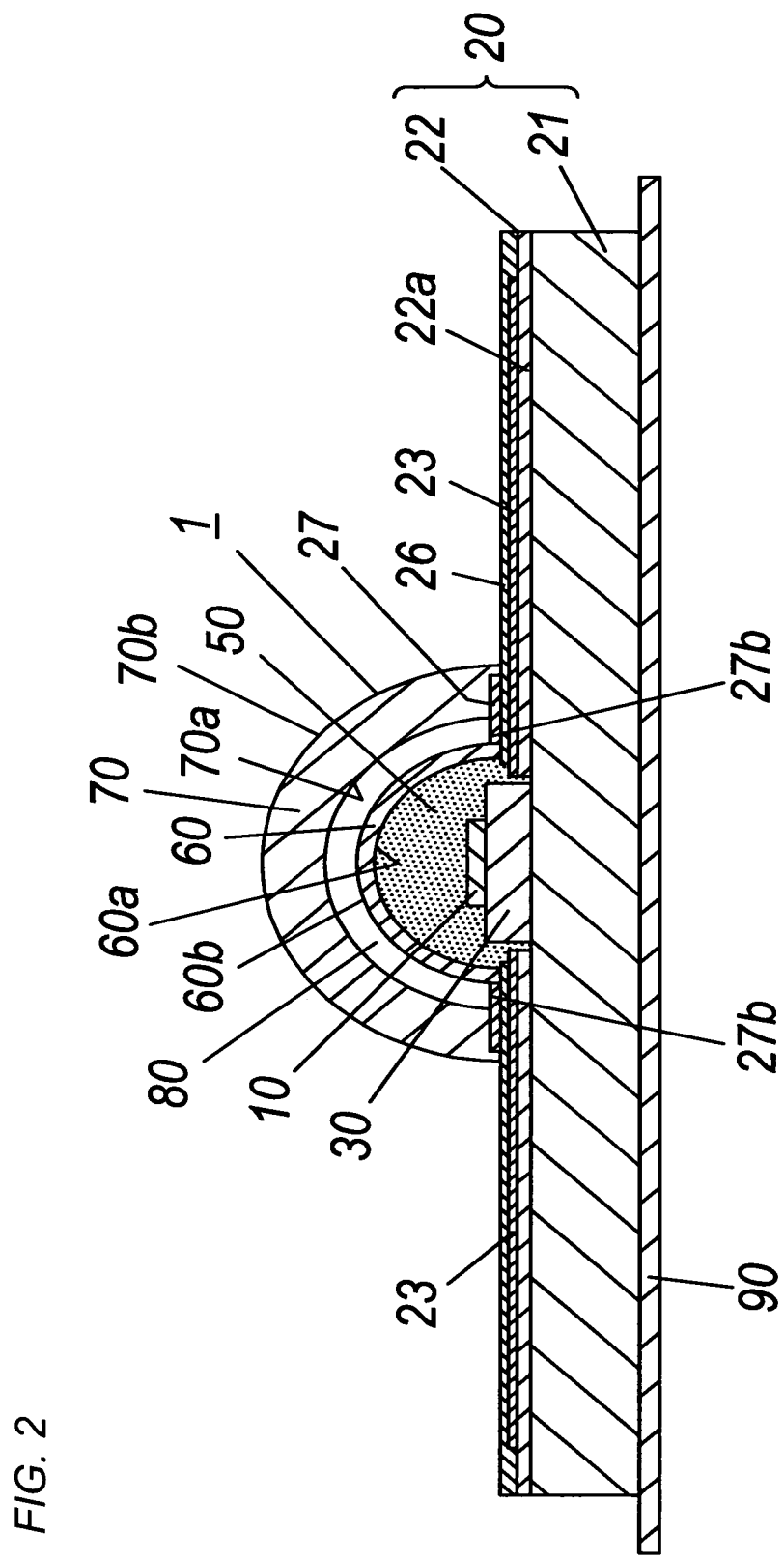
FIG. 2 shows a side sectional view of the above light emitting device

As shown in FIGS. 1 and 2, the light emitting device 1 in this embodiment comprises an LED chip 10, a mounting substrate 20 shaped into a rectangular plate which holds the LED chip 10, a dome-shaped optical member 60 made of a light-transmissive material, a light-transmissive elastic encapsulation resin 50, and a dome-shaped color conversion member 70. The mounting substrate 20 is provided at its top surface with a ring gate 27. The ring gate 27 is formed outside of the optical member 60 to protrude from the top surface of the mounting substrate. The mounting substrate 20 is provided at its top surface with the LED chip 10 and a patterned conductor 23 which supplies electric power to the LED chip 10. The encapsulation resin 50 is filled in a space confined between the optical member 60 and the mounting substrate 20 for encapsulating therewith the LED chip 10 and a plurality of (two in this embodiment) bonding wirings 14 in electrical connection with the LED chip 10. The optical member 60 is secured to the top surface of the mounting substrate 20 to cover the LED chip 10 for directing a light emitted from the LED chip 10 therethrough. In the process of disposing the optical member 60 securely to the mounting substrate 20, an extra encapsulation resin overflows from the area confined between the optical member and the mounting substrate. The ring gate 27 prevents the extra encapsulation resin from flowing outside. The dome-shaped color conversion member 70 is a molded product made of a transparent resin material and a phosphor. The phosphor is excited by a light which is emitted from the LED chip 10 and then travels through the encapsulation resin 50 and the optical member 60, so as to emit a light of a color different from a luminescent color of the LED chip 10. The color conversion member 70 is disposed on the top surface of the mounting substrate 20, so as to surround the optical member 60 with an air layer 80 being interposed between the optical member 60 and the color conversion member 70.

Figure 3:
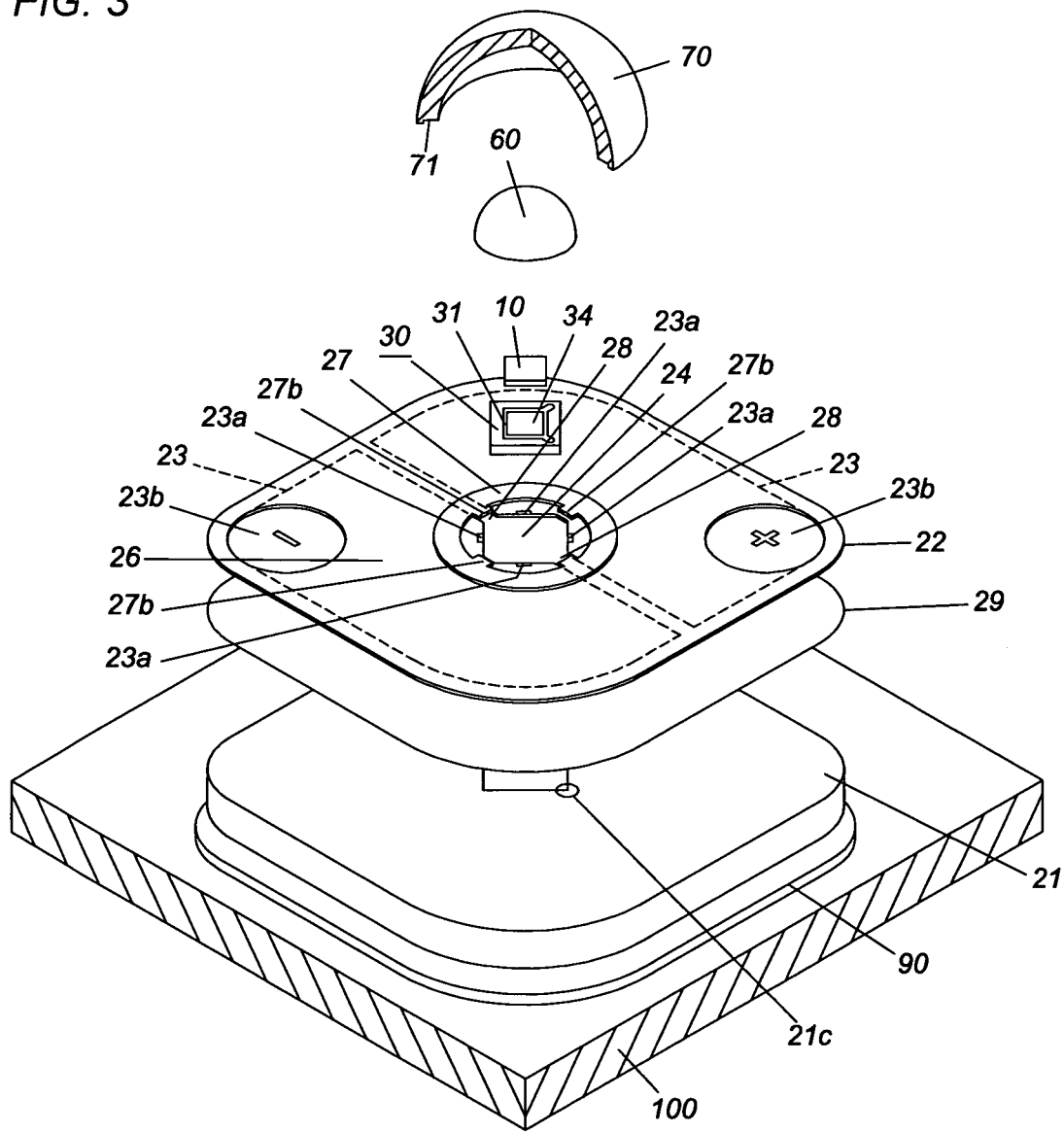
FIG. 3 shows an exploded perspective view of an essential part of a luminaire using the above light emitting device.

As shown in FIG. 3, the light emitting device 1 in this embodiment is provided at a bottom surface of the mounting substrate 20 with a sheet-shaped connecting member 90. The connecting member is made of a resin sheet which contains a filling material made of filler (such as silica and alumina) and exhibits a low viscosity when heated. (The resin sheet may be an organic green sheet such as an epoxy resin sheet highly filled with fused silica.) When utilized as a light source of a luminaire, the light emitting device 1 in this embodiment enables to connect a main body 100 (shown in FIGS. 3, 7, and 8) made of a metal (e.g., a highly thermally conductive metal such as Al and Cu) to the mounting substrate 20 by way of the connecting member 90. The resin sheet of the connecting member 90 exhibits very low electrical conductivity, high thermal conductivity, high fluidity when heated, and high adhesion to bumpy surfaces. In the process of connecting the mounting substrate 20 with the main body 100, the connecting member 90 is subjected to heat while being interposed therebetween. The connecting member enables to connect therethrough the mounting substrate 20 with the main body 100, without suffering from a void-generation, a rise in thermal resistance, and an ununiformity in thermal resistance which result from lack of adhesion. When interposed between the mounting substrate and the main body as in the light emitting device of this embodiment, the connecting member enables to minimize the thermal resistance between the LED chip 10 and the main body 100 for facilitating heat dissipation, compared to a conventional heat exhaustion rubber such as Sarcon (registered trademark). Besides, this connecting member enables to minimize ununiformity in the thermal resistance and the rise in junction temperature of the LED chip 10. With the use of connecting member, the light emitting device in this embodiment is allowed to accept an increased input electric power for giving a high light output. When being utilized as a light source of luminaire, a plurality of the light emitting devices are connected with each other in series or parallel on the main body 100.

The LED chip 10 is a GaN-based blue-color LED chip emitting a blue light. The anode (not shown) and the cathode (not shown) are respectively provided on the top surface and the bottom surface of the LED chip 10. Each of the cathode and the anode is formed of a laminate including Ni film and Au film.

The mounting substrate 20 is composed of a rectangular heat conducting plate 21 and a printed substrate 22 disposed on a top surface of the heat conducting plate 21. The printed substrate 22 is formed at its middle position with a rectangular opening 24. The printed substrate 22 is formed of a rectangular flexible printed substrate which is secured to a securing sheet 29 (shown in FIG. 3) such as a polyolefin sheet. A dielectric substrate (a sub-mount member) 30 is disposed on a top surface of the heat conducting plate 21 to pass through the opening 24 of the printed substrate 22. The heat conducting plate 21 holds the LED chip 10 with the dielectric substrate 30 being interposed therebetween. In this configuration, the heat generated from the LED chip 10 is allowed to be dissipated through the dielectric substrate 30 and the heat conducting plate 21, and not introduced to the printed substrate 22. The heat conducting plate 21 is provided at its top surface with an alignment mark 21c which allows the dielectric substrate 30 to be precisely positioned. The heat conducting plate 21 is formed of Cu in this embodiment, but may be formed of other thermally conductive material such as Al.

The printed substrate 22 includes a dielectric plate 22a. The dielectric plate 22a is made of a polyimide film. The dielectric plate 22a is provided at its top surface with a pair of patterned conductors 23 which supplies electricity to the LED chip 10, and a protection layer 26 made of white resist (resin). The protection layer 26 is disposed to cover therewith portions of the dielectric plate 22a not formed with the patterned conductors 23, as well as the patterned conductors 23. The protection layer 26 is arranged to reflect outward a light which is emitted from a lateral face of the LED chip 10, and prevent the light from being absorbed into the printed substrate 22. With this arrangement, the light emitting device is allowed to efficiently direct outward the light, for giving an improved light output. Each of the patterned conductors 23 is formed into substantially rectangular shape, and has a dimension marginally smaller than half of dimension of the dielectric plate 22a. The dielectric plate 22a may be formed of FR4, FR5, paper phenol, or the like.

The protection layer 26 is disposed to expose rectangular four terminal portions 23a of the patterned conductor 23 around a periphery of the opening 24, and two circular electrodes 23b near circumference of the printed substrate 22. The terminal portions 23a are respectively connected to bonding wires 14. Each patterned conductor 23 of the printed substrate 22 is formed of a laminate including Cu film, Ni film, and Au film. One of two electrodes 23b indicated by "+" (right one in FIG. 8) is electrically connected to the anode of the LED chip 10; the other indicated by "−" (left one in FIG. 8) is electrically connected to the cathode of the LED chip 10. The electrodes with signs, of "+" and "−" are visually identified, and may be free from erroneous electrical connection thereof.

In the light emitting device 1 of this embodiment, the LED chip 10 is disposed to the heat conducting plate 21 with the dielectric substrate 30 being interposed therebetween. The dielectric substrate 30 acts to relieve stress acting on the LED chip 10 due to a difference of coefficient of linear expansion between the LED chip and the heat conducting plate. The dielectric substrate 30 also acts to dissipate heat generated from the LED chip 10 to the heat conducting plate 21 which has a dimension larger than a chip size of the LED chip 10. The heat generated from the LED chip 10 can be efficiently dissipated through the dielectric substrate 30 and the heat conducting plate 21. The dielectric substrate is formed into rectangular plate having a dimension larger than the LED chip 10.

In this embodiment, the dielectric substrate 30 is made of a dielectric AlN exhibiting relatively high thermal conductivity. The dielectric substrate 30 is provided with a metal ground layer 31 (a patterned conductor in this embodiment) which holds the LED chip 10. The cathode is disposed on a bottom surface of the LED chip 10, and electrically connected to the metal ground layer 31. The metal ground layer 31 is electrically connected to one of the patterned conductors 23 of the mounting substrate 22 through the bonding wire 14 made of metal wire (e.g., Au wire, and Al wire). The anode is disposed on a top surface of the LED chip 10, and is electrically connected to the other of patterned conductors 23 of the mounting substrate 22 through the bonding wire 14. The heat conducting plate 21 is preferably connected to the dielectric substrate 30 by way of a Pb-free solder such as AuSn and SnAgCu. When being connected to the dielectric substrate by way of AuSn, the heat conducting plate 21 needs to be formed at its bonding surface with a metal layer of Au or Ag in advance. The dielectric substrate 30 is not required to be formed of AlN, and may be formed of a composite SiC.

Figure 5:
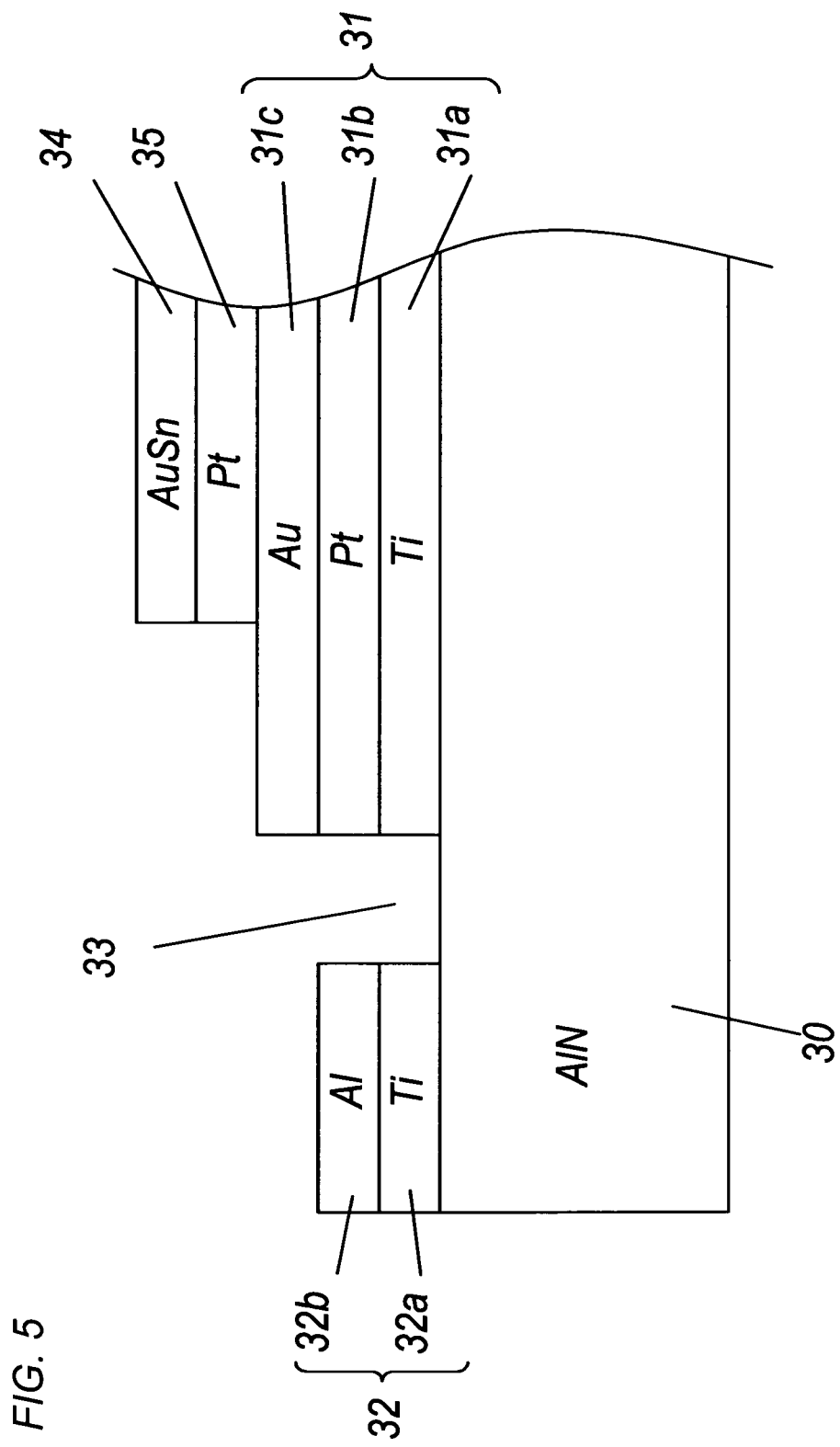
FIG. 5 shows the method of mounting the LED chip of the above light emitting device.

In the light emitting device 1 of this embodiment, the dielectric substrate 30 is arranged to be thick enough to have a top higher than that of the protection layer 26. With this arrangement, the light emitted from a lateral face of the LED chip 10 is prevented from being absorbed into the printed substrate 22 through an inner wall of the opening 24. The dielectric substrate 30 is provided with a reflection layer 32. The reflection layer 32 is designed to reflect thereon the light emitted from the lateral face of the LED chip 10 for preventing the light from being absorbed in the dielectric substrate 30, for achieving a further improved light output. For instance, the metal ground layer 31 may be formed of a laminate, which is formed of a Ti layer 31a acting as a securing layer, a Pt layer 31b acting as a diffusion prevention layer, and an Au layer 31c, as shown in FIG. 5. For instance, the reflection layer 32 may be formed of a laminate, which is made of a Ti layer 32a and an Al layer 32b, as shown in FIG. 5. The metal ground layer 31 of the dielectric substrate 30 is electrically isolated from the reflection layer 32 by a slit 33 which is interposed therebetween. The metal ground layer 31 is set to have thicknesses of 0.1 μm at the Ti film 31a, 0.2 μm at the Pt film 31b, and 0.5 μm at the Au film 31c, but may be set to have other thicknesses. The reflection layer 32 is set to have thicknesses of 0.1 μm at the Ti film 32a, and 0.3 μm at the Al film 32b, but may be set to have other thicknesses. The securing layer of the metal ground layer may be formed of Ta, Ni, W, Zr, Hf, Cr, or the like, instead of Ti. The diffusion prevention layer of the metal ground layer may be formed of Ni, Pd, Rh, Ru, W, or the like, instead of Pt.

The encapsulation resin 50 is made of silicon resin, but may be made of other one such as acryl resin.

The optical member 60 is a dome-shaped molded article made of light-transmissive material (e.g., silicone resin and glass). In this embodiment, the optical member 60 is a molded article made of silicone resin, enabling to minimize differences in refractive index and linear expansion coefficient between the optical member 60 and the encapsulation resin 50. Preferably, the optical member 60 is made of an acryl resin when the encapsulation resin 50 is an acryl resin.

Preferably, the light output surface 60b of the optical member 60 is shaped into a convex surface such that an interface between the light output surface 60b and the air layer 80 is free from a total reflection of the light radiated from the light input surface 60a. In this embodiment, the optical member 60 is disposed such that the center of the light output surface lies on a line passing through an optical axis of the LED chip 10. After emitted from the LED chip 10, the light is allowed to easily travel to the color conversion member 70 through the encapsulation resin 50, the optical member 60, and an air layer 80. With this arrangement, the light emitting device enables to give an increased overall light flux. After emitted from lateral face of the LED chip 10 and passing through the encapsulation resin 50, the optical member 60, and an air layer 80, one portion of the light excites the phosphor inside the color conversion member 70, other portion of the light travels inside the color conversion layer 70 without colliding with the phosphor. The optical member 60 is designed to have a constant wall thickness over the entire surface.

The color conversion member 70 is a molded article made of a mixture of the light-transmissive material (e.g. silicone resin) and yellowish phosphor particles. Each phosphor particle is excited by a blue light emitted from the LED chip 10 to emit a broad yellow-light. (Namely, the color conversion member 70 contains phosphors). The light emitting device 1 in this embodiment enables to radiate the blue-light emitted from the LED chip 10 and the yellow-light emitted from the yellowish fluorescent material, through the outer surface 70b of the color conversion member 70. This light emitting device 1 allows the blue-light and the yellow-light to be mixed with each other for giving a white-color light. The color conversion member 70 is made of silicone resin in this embodiment, but may be made of other light-transmissive material such as an acryl resin, a glass, an organic-inorganic hybrid material which is made of a mixture of, organic and inorganic nano-particles or an organic-inorganic hybrid molecule including organic and inorganic moieties. The phosphor in the color conversion member 70 is the yellowish phosphor in this embodiment, but may be a combination of other fluorescent materials such as a combination of reddish and greenish ones for achieving white-color light.

The color conversion member 70 is shaped to fit to the light output surface 60b of the lens 60 such that an inner surface 70a of the color conversion member 70 is spaced from the light output surface 60b of the lens 60 by an almost uniform distance, and configured to have a constant wall thickness over the entire surface. The color conversion member 70 needs to be secured at its peripheral bottom rim to the mounting substrate 20 by means of adhesive agent (e.g., silicone resin and epoxy resin).

Figure 7:
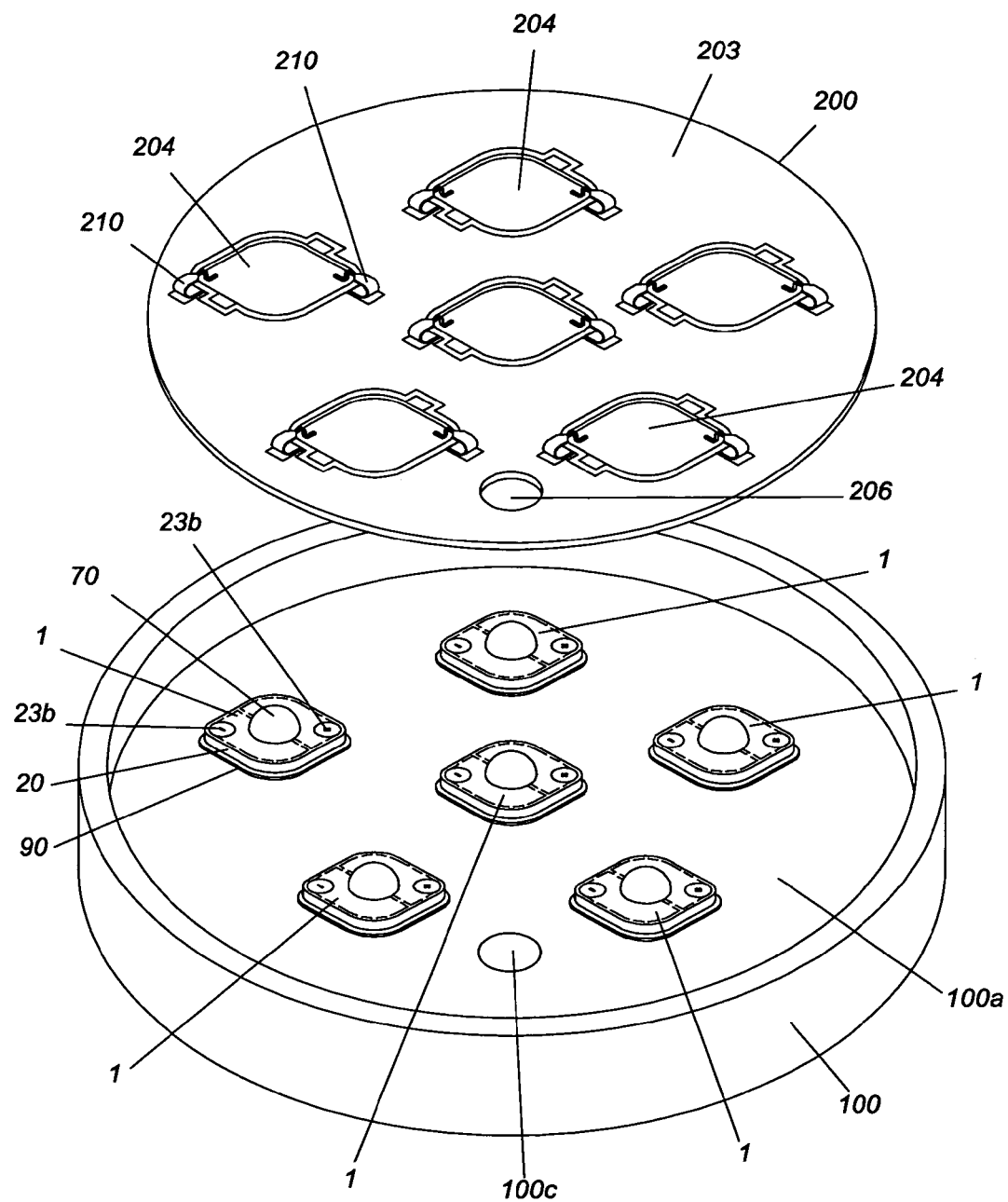
FIG. 7 shows a schematic explored perspective view of an essential part of the luminaire using the above light emitting device.
Figure 8:
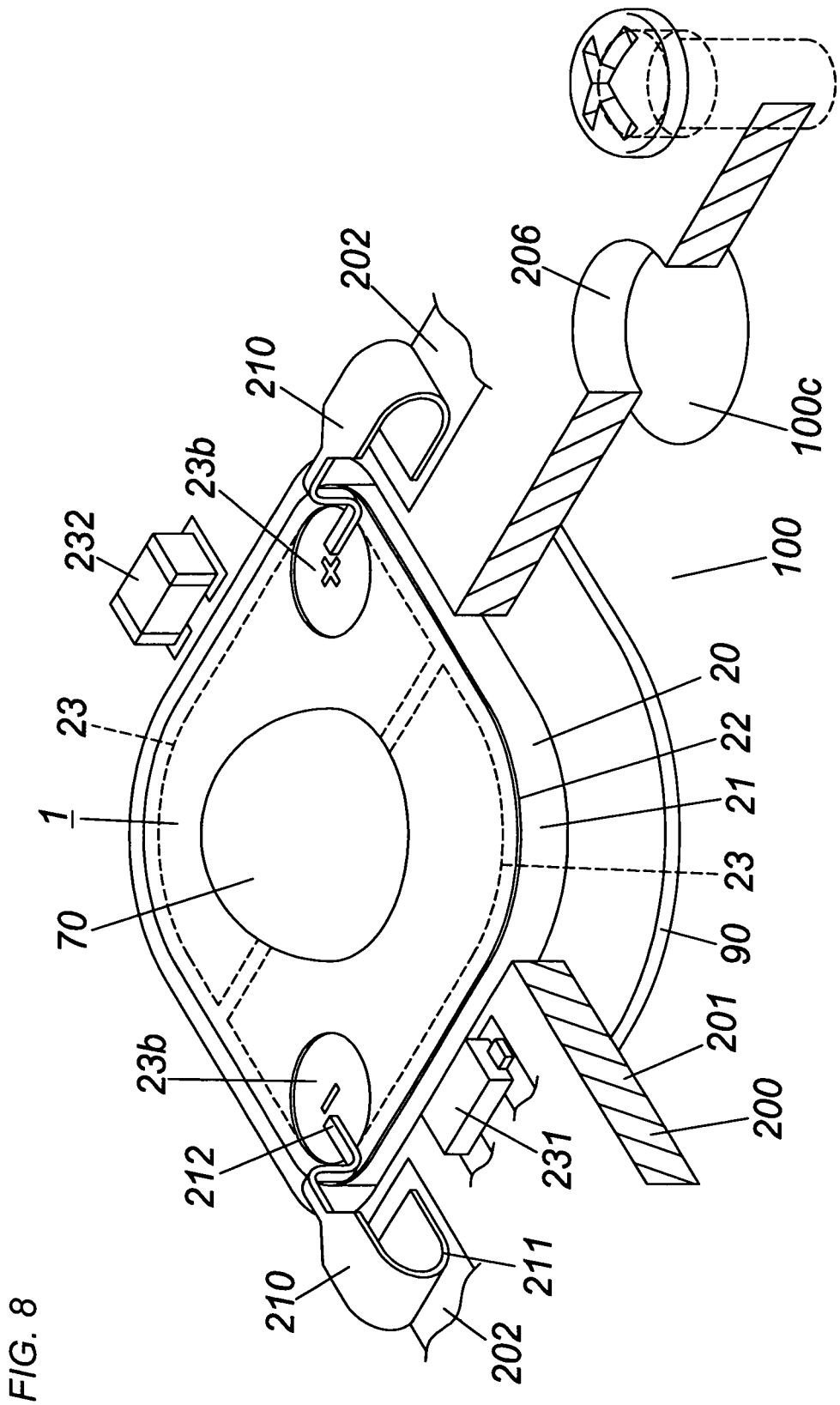
FIG. 8 shows a schematic perspective view of an essential part of the luminaire using the above light emitting device.

The luminaire in which the light emitting device 1 is utilized as a light source has a circuit substrate 200 including a dielectric board 201, as shown in FIGS. 7 and 8. The dielectric board 201 is provided at its top surface with patterned wiring 202 defining an electrical connection of a plurality of light emitting devices 1. A plurality of the light emitting devices 1 are connected with each other in series in this embodiment, but may be connected in parallel or connected in a series-parallel combination.

The circuit substrate 200 is disposed inside the main body 100 shaped like short cylinder so as to be spaced away from a bottom wall 100a of the main body 100. The circuit substrate 200 is formed with openings 204 for allowing a portion of each light emitting device to pass therethrough. The dielectric board 201 of the circuit substrate 200 may be made of a glass epoxy resin (e.g., FR4), a polyimide resin, or a phenol resin. The main body 100 may be formed into other shape such as plate-like.

The bottom wall 100a of the main body 100 is provided with an insertion opening 100c. The circuit substrate 200 is provided with an insertion opening 206. With this arrangement, the circuit substrate 200 is electrically connected to a pair of lead wiring which passes through the openings for electrical supply. The circuit substrate 200 is provided at its top surface remote from the bottom wall 100a of the main body, with a light-reflection layer 203 made of a white resist layer. The light-reflection layer 203 is configured to cover large part of patterned wiring 202 therewith.

The circuit substrate 200 is configured such that each of the openings 204 is marginally larger than a plane size of the mounting substrate 20 of each light emitting device. The circuit substrate 200 is provided nearby openings 204 with Zener diodes 231 (shown in FIG. 8) and ceramic condensers 232 which are disposed to protect the LED chip 10 of each light emitting device 1 from an excessive electric voltage applied thereto.

The light emitting device 1 is electrically connected to the patterned wiring 202 of the circuit substrate 200 through a terminal plate 210 of outer electrodes 23b of the mounting substrate 20. The terminal plate 210 is made of an elongated metal plate which is formed at its one end into a J-shape terminal 211 and at its other end into an L-shape terminal 212. The terminal 211 and the terminal 212 are respectively connected to the patterned wiring 202 and the electrode 23b by means of solder or like. These terminals are capable of relieving stress which acts on portions of the electrodes 23b and the patterned wiring 202 which are connected by way of the terminals 210 due to a difference of coefficient of linear expansion between the main body 100 and the circuit substrate 200. This arrangement enables to improve its bonding reliability between the light emitting device 1 and the circuit substrate 200.

The sheet-shaped connecting member 90 in the light emitting device 1 of this embodiment is formed to have a plane size larger than that of the heat conducting plate 21, enabling to increase a creepage distance between the heat conducting plate 21 and the main body (metallic member) 100, and eventually improving thunder-resistance surge, compared to a connecting member 90 having the same plane size as that of the heat conducting plate 21. (Outdoor luminaire is required to have a creepage distance different from that of indoor luminaire, between the light emitting device and the metallic member. Outdoor luminaire needs to have the creepage distance longer than that of the indoor luminaire.) The thickness of sheet-shaped connecting member 90 needs to be determined in accordance with a required pressure-resistance of the thunder-resistance surge. The sheet-shaped connecting member 90 is preferably formed thin for reducing a thermal resistance. Namely, the connecting member 90 needs to have a suitable thickness and a suitable plane size so as to meet the requirement of the creepage distance.

The light emitting device 1 can be fabricated in the following process. The LED chip 10 is electrically connected to the patterned conductors 23 by way of two bonding wires 14. Next, one portion of a liquid encapsulation resin (e.g., silicone resin) is poured through a hole 28 (which is formed continuously with the opening 24) to be filled inside the opening 24 of the printed substrate 22 around a periphery of the dielectric substrate 30, so as to be cured to become one portion of the encapsulation resin 50. Next, the optical member 60 is filled at its interior with the other portion of the liquid encapsulation resin (e.g., silicone resin). Subsequently, the optical member 60 are suitably positioned on the mounting substrate 20, so as to be secured to the mounting substrate 20 while the liquid encapsulation resin is cured to become the encapsulation resin 50. Finally, the color conversion member 70 is secured to the mounting substrate 20. In the above fabrication example of the light emitting device, the liquid encapsulation resin needs to be provided to the interior of the optical member 60 sufficiently so as to prevent void-generation inside the encapsulation resin 50.

Figure 6:
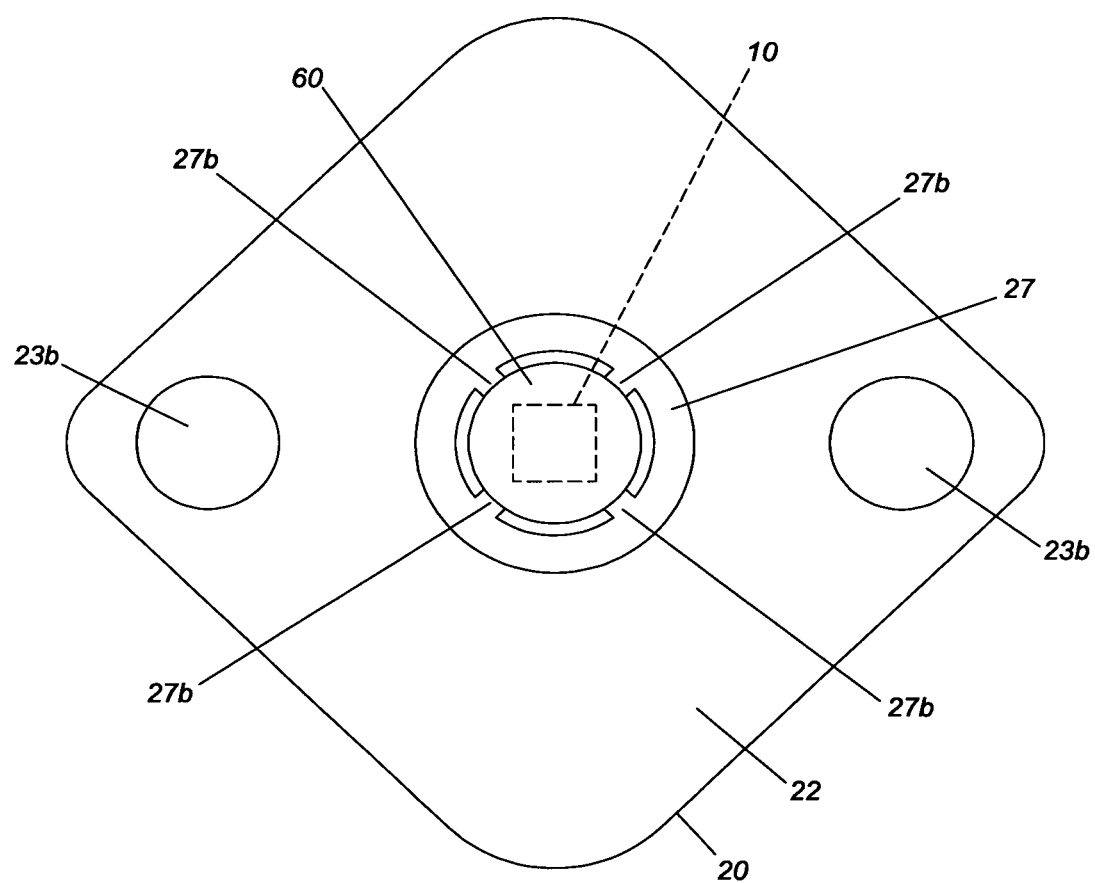
FIG. 6 shows a schematic plane view of an essential part of the above light emitting device.

In the light emitting device 1 in this embodiment, the mounting substrate 20 is provided at its top surface with the annular ring gate 27 which is formed to protrude therefrom outside of the optical member 60. In the process of disposing the optical member 60 securely to the mounting substrate 20, the ring gate 27 acts to prevent an extra liquid encapsulation resin which overflows from the portion confined between the optical member 60 and the mounting substrate 20, from flowing outside therethrough. The ring gate 27 is formed of a white resist. As shown in FIGS. 2, 3, and 6, the ring gate 27 is provided with a plurality of (four in this embodiment) centering projections 27b extending inward from its inner circumference. These centering positions are equally spaced circumferentially along inner circumference of the ring gate, so as to locate around the center axis of the optical member 60. The ring gate 27 also acts to position the color conversion member 70. The number of the centering positions 27b is four in this embodiment, and preferably three or more. Each centering position 27b is preferably formed to have a small width such that the encapsulation resin can be stored in high amount into a portion confined between the ring gate 27 and the optical member 60.

The process of fabricating the light emitting device in this embodiment enables to prevent void-generation inside the encapsulation resin 50, so as to provide a reliable light emitting device 1 giving high light output. A liquid encapsulation resin is filled into a portion confined by the optical member 60, the ring gate 27, and the protecting layer 26 on the mounting substrate 20, so as to be cured to become a resin portion 50b between the optical member 60 and the ring gate 27 in FIG. 1.

The color conversion member 70 is formed at inner peripheral bottom rim with a recess 71 for engaging with the ring gate 27. The light emitting device in this embodiment allows to precisely position the color conversion member 70 in relation to the mounting substrate 20, as well as shortening an interval between the color conversion member 70 and the optical member 60. The recess 71 is formed across the inner peripheral bottom rim and inner face 70a.

In the light emitting device of this embodiment, the mounting substrate 20 is provided at its top surface with the patterned conductor 23 which supplies electricity to the LED chip 10. In this configuration, the mounting substrate 20 is thermally coupled to the main body 100 of the luminaire so as to reduce a thermal resistance from the LED chip 10 to the main body 100, without being provided on the circuit substrate. This configuration enables to suppress a rise in a junction temperature of the LED chip 10, so as to accept an increased input power for giving a high light output. In the light emitting device 1, the mounting substrate 20 is provided at its top surface with the ring gate 27. The ring gate 27 enables to prevent void-generation inside the encapsulation resin 50, in fabrication of the light emitting device.

Figure 4:
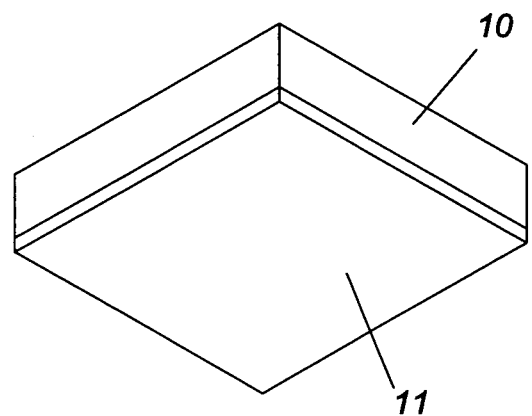
FIG. 4 shows a method of mounting an LED chip of the above light emitting device.
Figure 4:
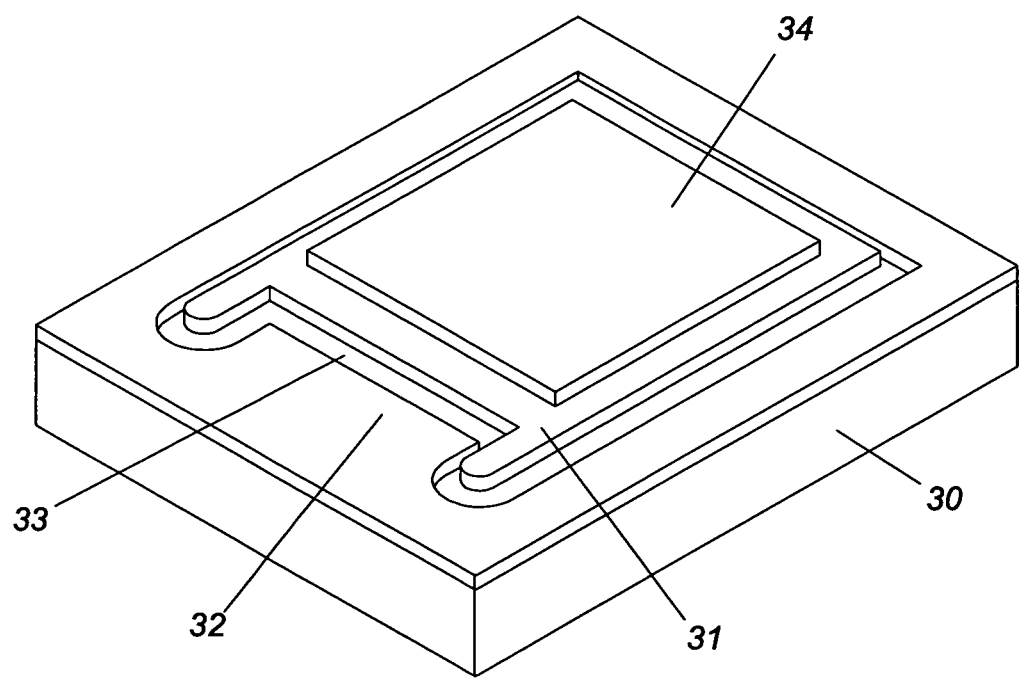

The LED chip 10 is provided at its bottom surface with a first metal layer 11 made of an AuSn layer, as shown in FIG. 4. The LED chip 10 is mounted to the dielectric substrate 30 by way of an eutectic bonding as follows. First, the dielectric substrate 30, acting as the mounting substrate is provided with the metal ground layer 31. Next, the metal ground layer 31 is provided at its one surface with a second metal layer 34 having the same metal component as the first metal layer 11. Subsequently, the LED chip 10 is connected to the dielectric substrate 30 through the eutectic bond by means of a die bonding apparatus, while the dielectric substrate 30 is heated at its bottom surface remote from said metal ground layer 31 by using a heat source (e.g., heater) such that the second metal layer 34 is melted without suffering from sudden boiling. In this embodiment, the first metal layer 11 is made of an AuSn layer having a specific thickness (e.g., 3 μm), and is disposed on the LED chip 10 by means of a PVD method such as spattering and vapor deposition. The second metal layer 34 is made of AuSn layer having a specific thickness (e.g., 0.5 μm), and is disposed by means of a PVD method such as spattering and vapor deposition to the metal ground layer 31 which is provided on the dielectric substrate 30. In this embodiment, the metal ground layer 31 is provided at its top surface with a Pt layer 35 (shown in FIG. 5) by means of a PVD method such as spattering and vapor deposition, before formed with the second metal layer 34. Each of the Pt layer 35 and the second metal layer 34 has the same plane size as the LED chip 10.

The process of mounting the LED chip 10 in this embodiment can accelerate the eutectic bonding, enabling to prevent void-generation inside the eutectic bond without use of flux.

In this embodiment, the first metal layer 11 is made of an AuSn layer having a metal composition ratio of 80Au-20Sn. The second metal layer 34 is formed of an AuSn layer having the same metal composition ratio (80Au-20Sn) as the first metal layer 11, for being uniformly formed together with the first metal layer. The second metal layer 34 may be formed to have a metal composition ratio different from that of the first metal layer 11 so as to have a melting point higher than that of the first metal layer 11, for being easily bonded therewith.

In this embodiment, the first metal layer is made of an AuSn layer. The metal ground layer 31 is formed to have a top surface made of Au. The metal ground layer 31 is formed at its top surface with the Pt layer 35, before provided with the second metal layer 34. Each of the Pt layer 35 and the second metal layer 34 has the same plane size as that of the LED chip 10, not extending the bonding excessively, and eventually preventing a short-circuit between junctions of the LED chips 10 by way of solder-ball which results from an eutectic alloy overflowing from an interface between the LED chip 10 and the dielectric substrate 30. This arrangement enables to prevent a short-circuit between the LED chips 10 by way of solder-ball which results from an eutectic alloy overflowing from an interface between each LED chip and the dielectric substrate, in the process of mounting a plurality of the LED chips 10 to the dielectric substrate 30.

Each of the metal layers 11,34 is made of an AuSn in this embodiment, but may be made of other alloy such as SnAgCu.

In the above process of mounting the LED chip 10 in this embodiment, the first metal layer 11 is made of an AuSn. When the metal ground layer 31 is formed at its top surface with an Au layer, the second metal layer 34 can formed of a laminate made of a Sn layer and an Au layer superimposed on the Sn layer, for generating eutectic bonding made of an AuSn eutectic alloy. This process enables to prevent the void-generation inside the eutectic bond without use of flux.

In the above embodiment, a blue-light LED chip is employed as the LED chip 10. The LED chip 10 may be selected to emit red-light, green-light, purple-light or UV-ray, instead of blue-light. In the light emitting device, the dielectric substrate 30 acting as a mounting substrate is provided with one LED chip 10 in the above embodiment, but may be provided with a plurality of LED chips 10. A plurality of the LED chips 10 may be selected to radiate a common color, or selected to radiate different colors. The dielectric substrates 30 is sub-mount member in this embodiment, but may be other one such as ceramic substrate.

The invention claimed is:

1. A method of mounting an LED chip to a dielectric substrate by way of a metallic bond, said method comprising steps of:
    forming, as a first step, a metal ground layer on a top surface of said dielectric substrate;
    forming, as a second step, a first metal layer of an eutectic alloy on a bottom surface of said LED chip;
    providing, as a third step, a second metal layer contacting the top surface of said metal ground layer, said second metal layer being an eutectic alloy of the same metal components as said first metal layer;
    heating, as a fourth step, said dielectric substrate at its bottom surface remote from said metal ground layer to melt said second metal layer; and
    bonding, as a fifth step, said first metal layer with said second metal layer, wherein
    the fourth step is performed after the first through third steps and before the fifth step, and
    said first metal layer has a metal composition ratio different from that of said second metal layer and a melting point lower than that of said second metal layer.

2. The method of mounting said LED chip as set forth in claim 1, wherein said first metal layer and said second metal layer are formed respectively of eutectic Au—Sn alloys,
    said metal ground layer having an Au layer at its top;
    said second metal layer being formed over a top of said Au layer with a Pt layer interposed therebetween,
    wherein each of said Pt layer and said second metal layer has the same plane size as said LED chip.

* * * * *